(12) United States Patent
Barry et al.

(10) Patent No.: US 7,443,328 B2
(45) Date of Patent: Oct. 28, 2008

(54) APPARATUS AND METHOD OF USING SPREAD PULSE MODULATION TO INCREASE THE CONTROL RESOLUTION OF AN ELECTRONIC DEVICE

(75) Inventors: Charles F. Barry, Santa Clara, CA (US); Tian Shen, Cupertino, CA (US); Reed A. Parker, Saratoga, CA (US); Feng F. Pan, San Jose, CA (US); Meenakshi Subramanian, Santa Clara, CA (US)

(73) Assignee: Brilliant Telecommunications, Inc., Campbell, CA (US)

(*) Notice: Subject to any disclaimer, the term of this patent is extended or adjusted under 35 U.S.C. 154(b) by 0 days.

(21) Appl. No.: 11/843,504

(22) Filed: Aug. 22, 2007

(65) Prior Publication Data

US 2008/0136691 A1 Jun. 12, 2008

Related U.S. Application Data

(60) Provisional application No. 60/839,513, filed on Aug. 22, 2006.

(51) Int. Cl.
*H03M 1/66* (2006.01)
(52) U.S. Cl. ................ 341/144; 341/142; 341/143; 341/131
(58) Field of Classification Search ........... 341/131, 341/142, 143, 144, 145, 152
See application file for complete search history.

(56) References Cited

U.S. PATENT DOCUMENTS

| | | | | |
|---|---|---|---|---|
| 3,893,102 A | * | 7/1975 | Candy | 341/145 |
| 4,006,475 A | * | 2/1977 | Candy et al. | 341/145 |
| 4,484,178 A | * | 11/1984 | Lovgren et al. | 341/153 |
| 4,593,271 A | * | 6/1986 | Candy | 341/131 |
| 6,647,428 B1 | | 11/2003 | Bannai et al. | |
| 6,950,050 B1 | * | 9/2005 | Jordan | 341/144 |
| 7,251,256 B1 | | 7/2007 | Barry et al. | |

* cited by examiner

*Primary Examiner*—Howard Williams
(74) *Attorney, Agent, or Firm*—Cooley Godward Kronish LLP

(57) ABSTRACT

An apparatus and method are described to increase the control resolution of an electronic device. In one embodiment, the invention includes a spread pulse modulation module to generate a first set of bits based on a second set of bits that is larger than the first set of bits. The spread pulse modulation module modulates the least significant bit (LSB) of the first set of bits based on information including the LSB modulation period and the LSB modulation duty cycle. The spread pulse modulation module also modulates the least significant bit of the first set of bits so that the least significant bit transitions at least twice from a high value to a low value during the modulation period. This embodiment of the invention also includes a digital-to-analog conversion module to generate an analog input signal to the electronic device based on the first set of bits.

20 Claims, 4 Drawing Sheets

APPARATUS AND METHOD OF USING SPREAD PULSE MODULATION TO INCREASE THE CONTROL RESOLUTION OF AN ELECTRONIC DEVICE

CROSS-REFERENCE TO RELATED APPLICATIONS

This application claims priority to U.S. Provisional Application Ser. No. 60/839,513, filed Aug. 22, 2006, which is incorporated by reference in its entirety.

FIELD OF THE INVENTION

The present invention relates generally to processing of signals used to control electronic devices. More particularly, this invention is directed towards using spread pulse modulation to increase the control resolution of an electronic device.

BACKGROUND OF THE INVENTION

Precise control of the output of an electronic device is useful for many applications. For example, precise control of the output frequency of an oscillator, such as a voltage-controlled crystal oscillator (VCXO) or oven-controlled crystal oscillator (OCXO), may be useful to maintain a strong phase lock to a highly accurate external time reference, such as a Global Positioning System (GPS) reference, at a network device. This phase locking can help to enable real-time applications and services such as Pseudo-Wire Emulation (PWE), Voice over IP (VoIP), video conferencing, and streaming services, which may require highly accurate timing across multiple network devices to ensure high service quality.

The output of an electronic device, such as the output frequency of a VCXO, is a function of a control voltage applied to the device and environmental factors. In the case of a VCXO, these environmental factors may include ambient temperature, altitude, humidity, acceleration experienced by the oscillator, and age of the oscillator. The impact of these environmental factors on the output of an oscillator may be determined by calibrating the oscillator and/or a population of oscillators with the same design against a highly accurate frequency reference, such as a rubidium oscillator locked to the Global Positioning System (GPS). The result of this calibration may be lookup tables and/or curve fit approximations relating oscillator output frequency to control voltage for a range of values of the environmental factors.

Based on measured values of environmental factors such as temperature and age, the desired control voltage to be applied to an electronic device such as a VCXO may be interpolated from the lookup tables and/or calculated from the fitted curves. This interpolation may be performed by a processing module, such as a central processing unit (CPU), programmable logic, or customized hardware such as an application specific integrated circuit (ASIC). However, the digital output of the processing module may need to be converted to the desired control voltage using a digital-to-analog converter (DAC). An N-bit DAC typically has an output voltage that corresponds to each N-bit digital input value, where this correspondence may be defined in one or more lookup tables that may vary based on environmental factors such as ambient temperature. The desired control voltage of the electronic device is typically specified to a greater precision than is attainable by selecting a DAC output voltage corresponding to one of the N-bit digital input values. Setting the DAC input to the N-bit digital input value with a corresponding DAC output voltage nearest to the desired control voltage of the electronic device may not result in good long-term system performance. For example, the application of the nearest DAC output voltage to the desired control voltage of a VCXO results in an output frequency offset from the desired output frequency of the VCXO, and therefore results in an accumulating phase error as long as this offset remains.

One approach to reduce this frequency offset and the corresponding accumulated phase error may be to modulate the least significant bit (LSB) of a given N-bit DAC input on and off, using Pulse Width Modulation (PWM). Conceptually, the goal of PWM is to effectively increase the resolution of the DAC through modulation of the LSB, and correspondingly the control resolution of the electronic device, so that the control voltage applied to the electronic device is in some sense a weighted average of the DAC output voltages corresponding to the given N-bit DAC input with the LSB on and off. PWM may control the duty cycle of the LSB of the N-bit DAC input so that the desired number, U, of "ones" are consecutively followed by X-U "zeroes", where X refers to the number of update clock cycles in an update period, or LSB modulation period, and U refers to a number of update clock cycles less than or equal to X. The DAC output voltage then may vary as a function of the N-bit DAC input, such as by assuming one value when the LSB is "one" and another value when the LSB is "zero".

The effect of PWM on the output of the electronic device that takes the DAC output voltage as its input may depend on the characteristics of that device. For example, electronic devices such as VCXOs may be approximately modeled as the combination of a low pass frequency response and a mapping of an input voltage to an output frequency. The input control voltage used to obtain the output frequency, instead of being the DAC output voltage, may therefore be a low pass filtered, or integrated, DAC output voltage. The input control voltage obtained using PWM may be closer to the desired control voltage than the input control voltage without PWM.

However, the PWM approach may not result in desirable system performance. The problem is that the long strings of U "ones" and X-U "zeroes" generated by PWM can result in substantial fluctuations in the input control voltage away from the desired control voltage. These fluctuations in the input control voltage may result in significant and repetitive variations in the output frequency of the electronic device away from the desired output frequency, which may degrade the performance of real-time applications and services.

To address this shortcoming, it would be desirable to provide a modulation approach that can effectively increase the resolution of the DAC, and correspondingly the control resolution of the electronic device, without creating the long strings of "ones" and "zeroes" that can result in large ripples in the input control voltage.

SUMMARY OF THE INVENTION

An apparatus and method are described to increase the control resolution of an electronic device. One embodiment of the invention includes a spread pulse modulation module to generate a first set of bits based on a second set of bits that is larger than the first set of bits. The spread pulse modulation module modulates the least significant bit (LSB) of the first set of bits based on information including the LSB modulation period and the LSB modulation duty cycle. The spread pulse modulation module also modulates the least significant bit of the first set of bits so that the least significant bit transitions at least twice from a high value to a low value during the modulation period. This embodiment of the invention also includes a digital-to-analog conversion module to generate an analog input signal to the electronic device based on the first set of bits.

BRIEF DESCRIPTION OF THE DRAWINGS

For a better understanding of the nature and objects of the invention, reference should be made to the following detailed description taken in conjunction with the accompanying drawings, in which.

DETAILED DESCRIPTION OF THE INVENTION

Spread pulse modulation (SPM) effectively increases the resolution of a DAC by modulating the LSB of the DAC input. SPM modulates the LSB by spreading U "ones" as uniformly as possible over a LSB modulation period of X update clock cycles, rather than having U consecutive "ones" be followed by X-U consecutive "zeroes". If U has a value between two and X-2 inclusive, where X is at least 4, SPM, unlike PWM, ensures that there will be at least two LSB transitions from a "one" to a "zero" during a LSB modulation period. Through this spreading, SPM can reduce the fluctuations of the input control voltage to an electronic device with a low pass frequency response, such as a VCXO, as compared to a modulation approach such as PWM. Note that for values of U and X outside the above-specified range, SPM, like PWM, results in fewer than two LSB transitions from a "one" to a "zero" during a LSB modulation period.

Figure 1:
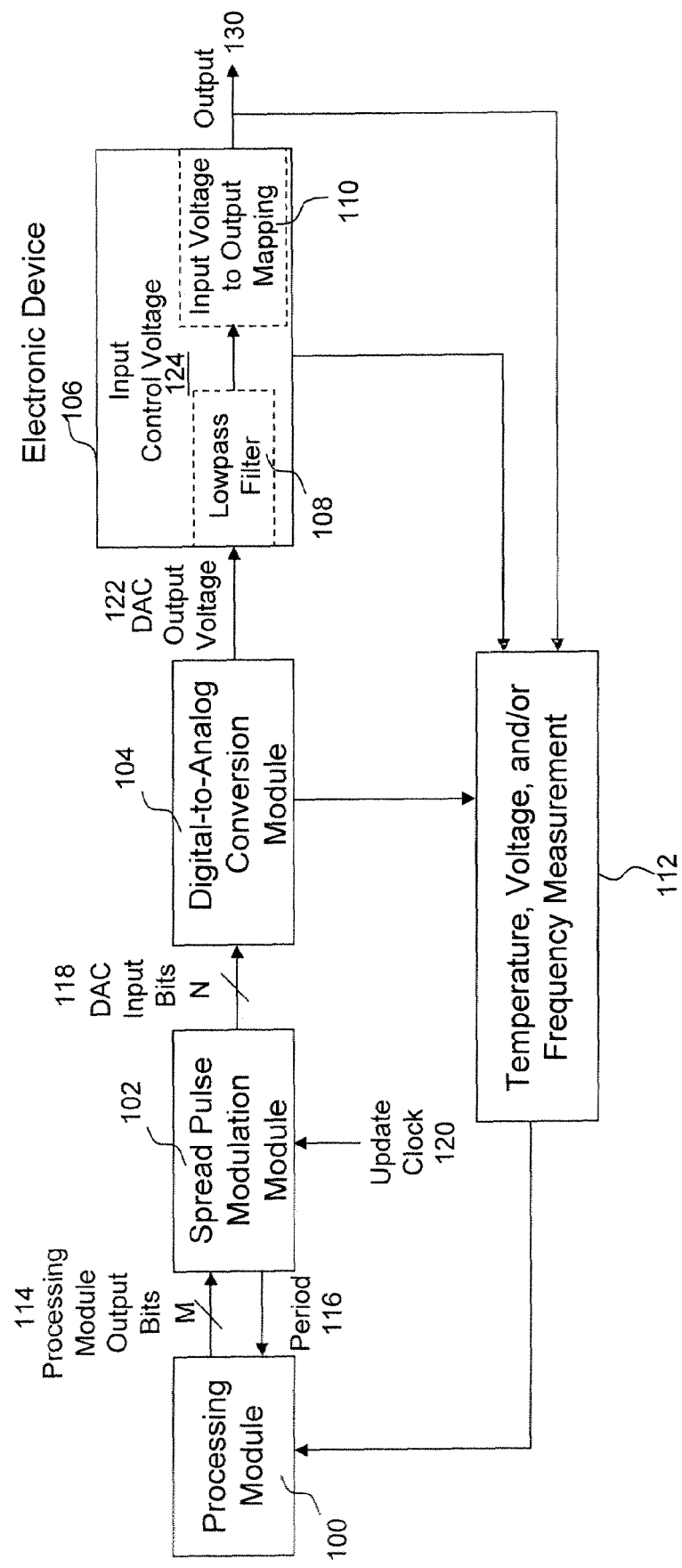
FIG. 1 illustrates a logical block diagram of a closed-loop system for controlling the output of an electronic device using spread pulse modulation, in accordance with one embodiment of the present invention.

FIG. 1 illustrates a logical block diagram of a closed-loop system for controlling the output of an electronic device using SPM, in accordance with one embodiment of the present invention. The processing module 100 may be a central processing unit (CPU), programmable logic, or customized hardware such as an application specific integrated circuit (ASIC). The processing module 100 generates an M-bit processing module output 114 based on inputs such as lookup tables and/or fitted curves for a DAC module 104 and an electronic device 106. The DAC module 104 may be separate from the electronic device 106, or the DAC module 104 may be integrated within the electronic device 106. The lookup tables and fitted curves for the DAC module 104 may relate an N-bit DAC input 118 to a DAC output voltage 122. The lookup tables and fitted curves for the electronic device 106 may specify an input voltage to output mapping 110 that relates the electronic device output 130 to the input control voltage 124. Both sets of lookup tables and fitted curves may take into account various environmental factors such as ambient temperature, the temperature of the DAC module 104 and the electronic device 106, altitude, humidity, acceleration experienced by the electronic device 106, and age of the electronic device 106. In one embodiment, the processing module 100 may implement closed-loop control of the electronic device 106 by generating the M-bit processing module output 114 based on temperature, voltage, and/or frequency measurements 112, where the temperature may be measured at the DAC module 104 and the electronic device 106, the voltage may be measured at the electronic device 106, and the frequency may be measured at the electronic device output 130. The processing module 100 may also take into account the age of the circuit, where the age of the circuit may represent the total time period that the circuit has been in operation, or the total time period since the most recent power-up. The processing module 100 may utilize a signal 116 indicating the LSB modulation period, that may be provided by an SPM module 102, to facilitate tracking of the circuit age by the processing module 100. The processing module 100 may compute an integrated phase error between the electronic device output 130 and a predicted electronic device output computed by the processing module 100, and utilize this integrated phase error as part of the closed-loop control of the electronic device 106. In another embodiment, the processing module 100 may implement open-loop control of the electronic device 106 and not take into account the temperature, voltage, and/or frequency measurements 112 when generating the M-bit processing module output 114.

The SPM module 102 may update the N-bit DAC input 118 using various approaches, such as updating once per update clock cycle, or on change of the N-bit DAC input 118. The SPM module 102 generates an N-bit DAC input 118 based on the M-bit processing module output 114, where M is greater than N. The result of SPM may be that the effective resolution of the DAC module 104 is M bits.

The SPM module 102 may modulate the LSB of the N-bit DAC input 118 based on information including the LSB modulation period and the LSB modulation duty cycle. The LSB modulation period may be predetermined or may be configured by the processing module 100. In one embodiment, the LSB modulation period may be X cycles of the update clock 120, where X equals $2^P$, and where M equals N+P-1. In this embodiment, the LSB may transition on an edge of the update clock. The LSB modulation duty cycle may be configured by the processing module 100. In one embodiment, a desired number, U, of "ones" in the LSB modulation period may be set as the value Q contained in P bits of the M-bit processing module output 114. In this embodiment, the LSB modulation duty cycle is U/X.

In addition to LSB modulation, the SPM module 102 may also concurrently modulate the LSB modulation duty cycle. The SPM module 102 may update the LSB modulation duty cycle once per LSB modulation period. In one embodiment, the SPM module may toggle the value of U, the number of "ones" per LSB modulation period, between a value Q set in P bits of the M-bit processing module output 114, and the least significant P bits of Q+1. The duty cycle modulation period may be predetermined or may be configured by the processing module 100. In one embodiment, the duty cycle modulation period may be K LSB modulation periods, where K equals $2^L$, and where M=N+P+L-1. The number of toggles in a duty cycle modulation period of the number of "ones" per LSB modulation period may be the value R set in L bits of the M-bit processing module output 114.

The DAC module 104 generates the DAC output voltage 122, based on the N-bit DAC input 118. The DAC output voltage 122 is the physical, analog input voltage to the electronic device 106. The electronic device 106 may have a low pass frequency response represented by the low pass filter 108. Conceptually, this indicates that the output 130 of the electronic device 106 does not change in response to sufficiently high-frequency variations in the DAC output voltage 122. The input control voltage 124 represents the low pass filtered DAC output voltage 122. Variations in the input control voltage 124 map to variations in the electronic device output 130 based on the input voltage to output mapping 110.

SPM maintains the desired duty cycle U/X of the N-bit DAC input signal 118 and, by spreading the "ones" as uniformly as possible over the LSB modulation period, correspondingly may reduce the low frequency spectrum of the DAC output voltage 122. As a result, the remaining higher frequency spectral components may be more completely filtered by the low pass filter characteristic 108 of the electronic device 106 than when PWM is used, resulting in the input control voltage more accurately approximating the desired control voltage, which is the average of the DAC output voltage over the LSB modulation period.

Figure 2:
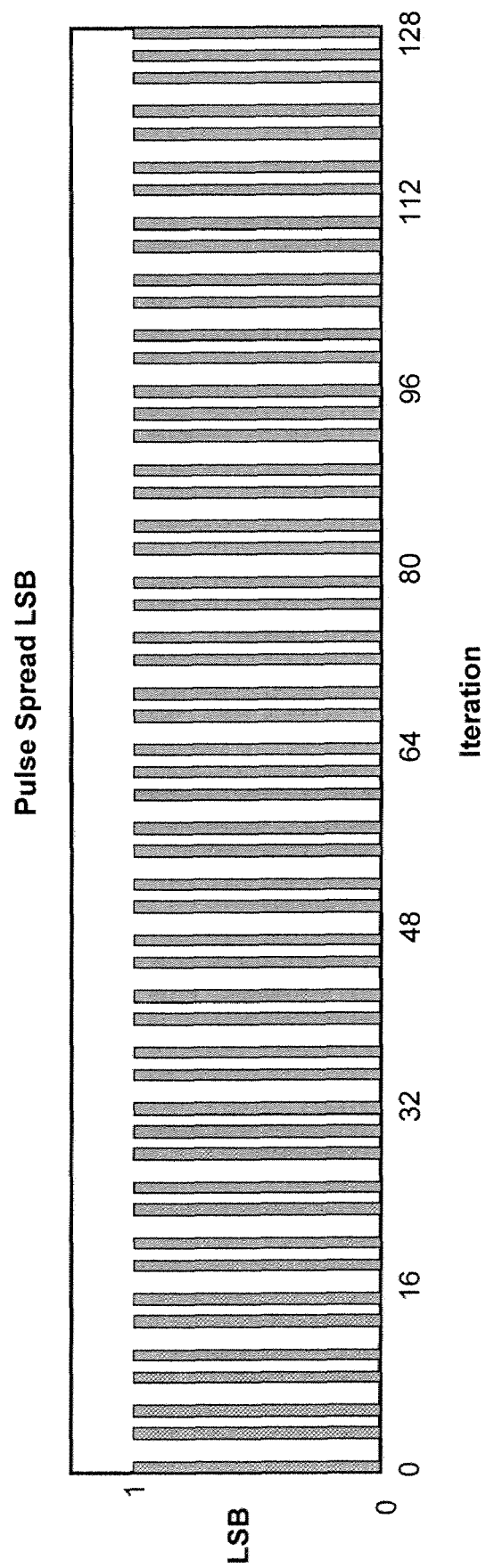
FIG. 2 illustrates the least significant bit of the N-bit digital-to-analog converter input signal generated by the spread pulse modulation module for a duty cycle of 13/32, in accordance with one embodiment of the present invention.

FIG. 2 illustrates the LSB of the N-bit DAC input signal generated by the SPM module for a duty cycle of 13/32, in accordance with one embodiment of the present invention. The 13 "ones" per LSB modulation period are spread approximately uniformly over the 32 update clock cycles of the LSB modulation period.

Figure 3:
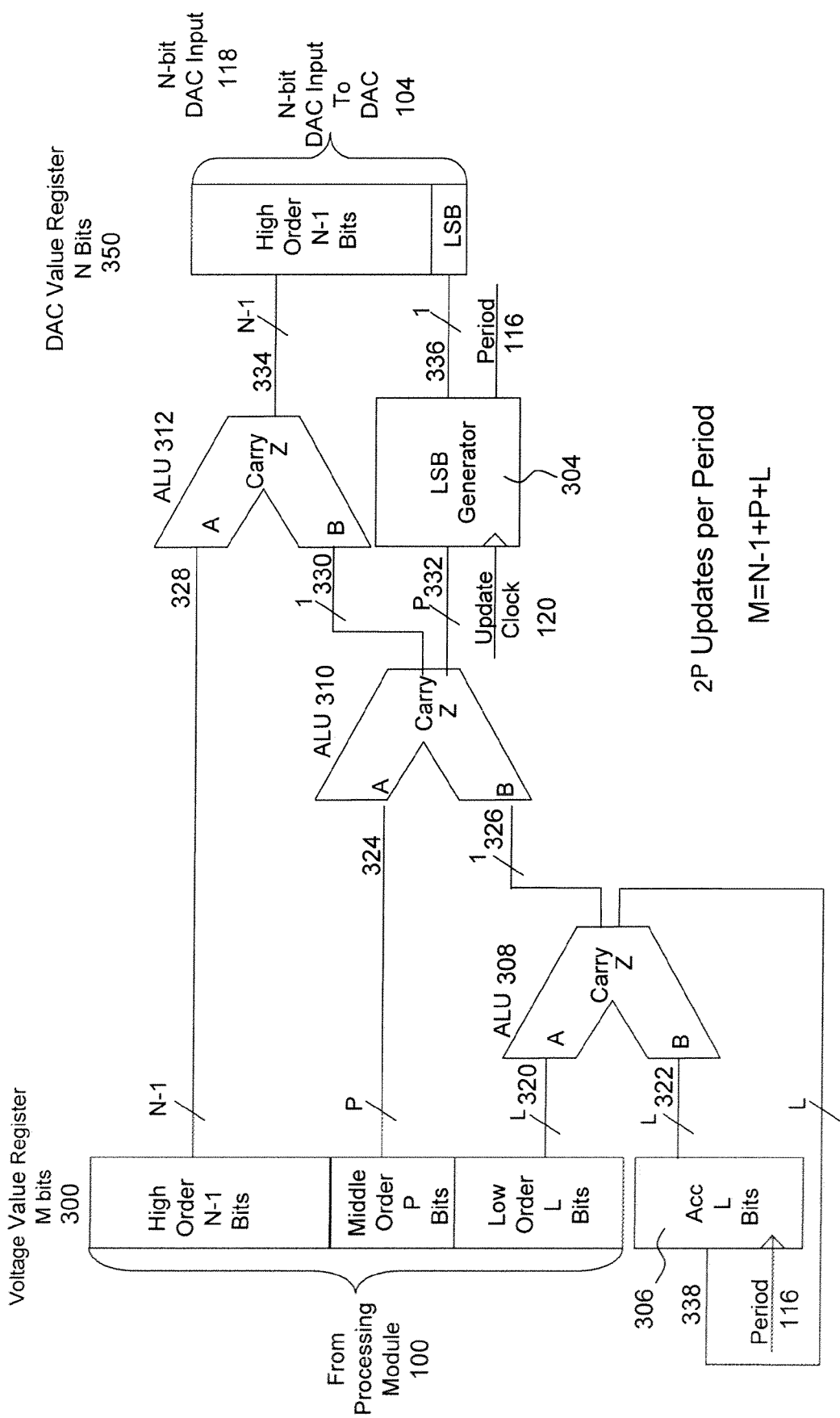
FIG. 3 illustrates a logical circuit representation of the spread pulse modulation module, in accordance with one embodiment of the present invention.

FIG. 3 illustrates a logical circuit representation of the SPM module 102, in accordance with one embodiment of the present invention. The M-bit voltage value register 300 may be sourced from the processing module 100. In this embodiment, M=N+P+L−1, so the M-bit voltage value register 300 can be subdivided in to N−1 high order bits, P middle order bits and L low order bits. The value of the L low order bits, represented by signal 320, may be R, the number of toggles in a duty cycle modulation period of the number of "ones" per LSB modulation period. An L-bit Arithmetic Logic Unit (ALU) 308 may sum signal 320 with signal 322, the contents of an L-bit register 306. Signal 338, the least significant L bits of the output of ALU 308, may be stored in L-bit register 306 as an accumulated value. The carry bit of the summing operation of ALU 308 may be represented by signal 326. The summing operation of ALU 308 may occur when triggered by signal 116 representing the LSB modulation period, such as on a rising edge of signal 116.

The variation of the signal 326 between "one" and "zero" may represent the value used to modulate the value Q in the middle order P bits, represented by signal 324. P-bit ALU 310 may perform this modulation by summing signal 324 and signal 326. Signal 332, the least significant P bits of the output of ALU 310, may be provided to LSB generator 304. Signal 332 may represent U, the desired number of "ones" in the LSB modulation period, which in this embodiment is $X=2^P$ cycles of the update clock 120. The LSB generator 304 may take signal 332 and the update clock 120 as inputs, and may generate outputs including the signal 116 representing the LSB modulation period and signal 336 representing the value of the LSB of the N-bit DAC input 118 to the DAC module 104. The carry bit of the summing operation of ALU 310 may be represented by signal 330. The summing operation of ALU 310 may occur when triggered by a change in signal 324 or in signal 326.

The variation of the signal 330 between "one" and "zero" may represent the value that (N−1)-bit ALU 312 may add to the high order N−1 bits, represented by signal 328. Signal 330 may be "one" when modulation of the LSB modulation duty cycle causes Q+1 to exceed a value expressible in P bits. In this embodiment, signal 330 may be "one" when $Q=2^P-1$ and when signal 326 is "one", causing signal 332, U, to become all "zeros". The least significant N−1 bits of the sum, shown as signal 334, may represent the value of the N−1 most significant bits of the N-bit DAC input 118 to the DAC module 104. The N-bit DAC input 118 may be stored in a DAC value register 350. In the event that the high-order N−1 bits are all "ones", then one approach that may be used to prevent a rollover of the high-order N−1 bits of the N-bit DAC input 118 is to switch signal 328 to connect directly to the high-order N−1 bits of the N-bit DAC input 118, bypassing ALU 312.

In an embodiment, the DAC value register 350 may be loaded in parallel. In another embodiment, the DAC value register 350 may be loaded serially by shifting in the N bits of the DAC value register 350 with a clock sufficiently fast to ensure that the DAC value register 350 can be fully loaded within a single update clock cycle.

Figure 4:
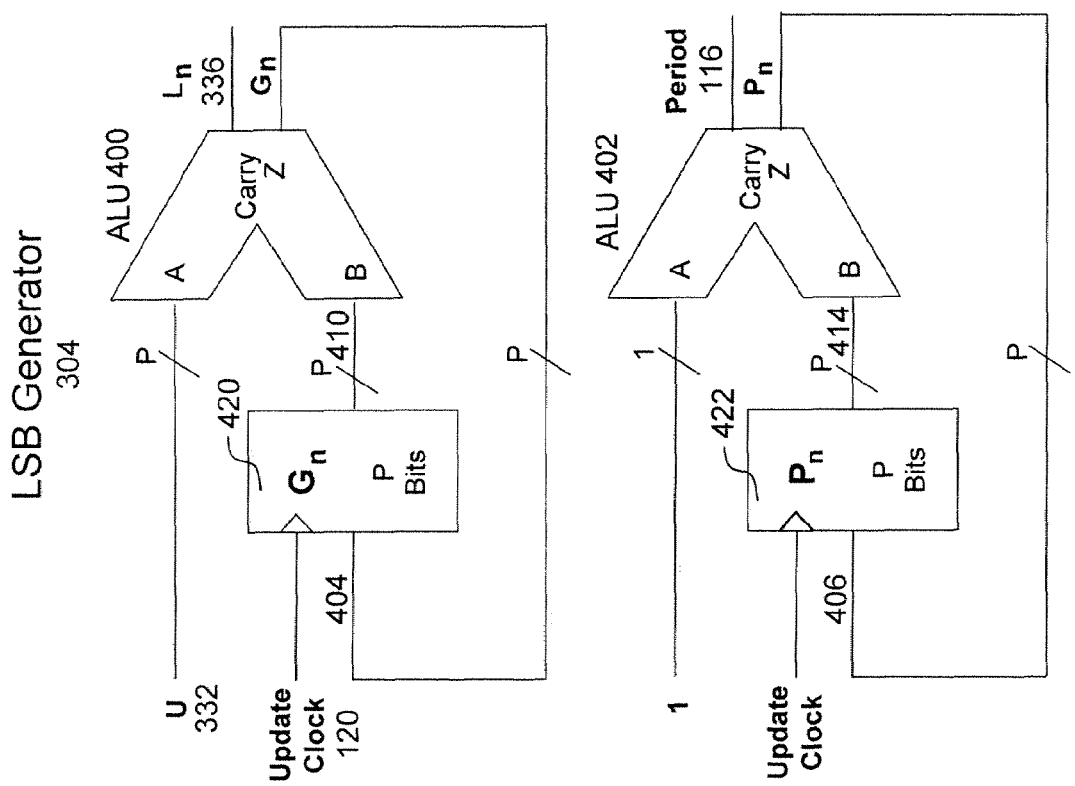
FIG. 4 illustrates a logical circuit representation for the LSB generator logic block of the spread pulse modulation module, in accordance with one embodiment of the present invention.

FIG. 4 illustrates a logical circuit representation for the LSB generator logic block 304 of the SPM module 102, in accordance with one embodiment of the present invention. A P-bit wide accumulator 420 may be updated by using P-bit ALU 400 to successively add U, represented by signal 332, to signal 410, representing the contents of accumulator 420, at each cycle of the update clock 120. The carry bit of ALU 400 may be signal 336, the LSB of the N-bit DAC input 118 in FIG. 3. In this embodiment, the value of signal 336 at the $n^{th}$ cycle of the update clock 120 may be represented by value $L_n$. The least significant P bits of the output of ALU 400 may be represented by signal 404, with value $G_n$ at the $n^{th}$ cycle of the update clock 120. Signal 404 may be used to update accumulator 420. $G_n$ and $L_n$ may be mathematically expressed as:

$$G_n = (G_{n-1} + U) \bmod X;$$

$$L_n = ((G_n \bmod X) < U).$$

$L_n$ has the value "one" when ($G_n$ mod X) is less than U.

In this embodiment, a P-bit wide accumulator 422 may also be updated by using P-bit ALU 402 to successively add "one" to signal 414, representing the contents of accumulator 422, at each cycle of the update clock 120. The carry bit of ALU 402 may be signal 116 representing the LSB modulation period. In this embodiment, the value of signal 116 at the $n^{th}$ cycle of the update clock 120 may be represented by value Period. The least significant P bits of the output of ALU 402 may be represented by signal 406, with value $P_n$ at the $n^{th}$ cycle of the update clock 120. Signal 406 may be used to update accumulator 422. Period and $P_n$ may be mathematically expressed as:

$$P_n = (P_{n-1} + 1) \bmod X;$$

$$\text{Period} = (P_n == 0).$$

Period has the value "one" when $P_n$ equals 0.

In this embodiment, X, the number of updates of the LSB during an LSB modulation period, is greater than zero and a power of 2, e.g., $2^P$, and thus the modulo X function is simply a P-bit register. The foregoing rules may result in signal 336, the LSB of the N-bit DAC input 118 in FIG. 3, having U approximately evenly spaced ones over an LSB modulation period. The LSB generator further outputs a Period pulse once per LSB modulation period.

From the foregoing, it can be seen that an apparatus and method for using spread pulse modulation to increase the control resolution of an electronic device are described. The foregoing description, for purposes of explanation, used specific nomenclature to provide a thorough understanding of the invention. It will be appreciated, however, that embodiments of the invention can be in other specific forms without departing from the spirit or essential characteristics thereof. The described embodiments are not intended to be exhaustive or to limit the invention to the precise forms disclosed; obviously, many modifications and variations are possible in view of the above teachings. The presently disclosed embodiments are, therefore, considered in all respects to be illustrative and not restrictive. The embodiments were chosen and described in order to best explain the principles of the invention and its practical applications; they thereby enable others skilled in the art to best utilize the invention and various embodiments with various modifications as are suited to the particular use contemplated. It is intended that the following claims and their equivalents define the scope of the invention.

What is claimed is:

1. An apparatus to increase the control resolution of an electronic device, comprising:
a spread pulse modulation module to generate a first set of bits based on a second set of bits, wherein the second set of bits is larger than the first set of bits, and wherein the spread pulse modulation module performs a first modulation of the least significant bit of the first set of bits based on information including a period of the first modulation and a duty cycle of the first modulation, and wherein the least significant bit transitions at least twice from a high value to a low value during the period of the first modulation, and wherein a control signal input to the electronic device is determined based on the first set of bits.

2. The apparatus of claim 1, wherein the least significant bit transitions on an edge of an update clock, and wherein the number of update clock cycles in a period of the first modulation is a power of two.

3. The apparatus of claim 2, wherein the control signal input to the electronic device is an analog signal output of a digital-to-analog conversion module.

4. The apparatus of claim 3, wherein the digital-to-analog conversion module is updated once per update clock cycle.

5. The apparatus of claim 3, wherein the digital-to-analog conversion module is updated on change of the first set of bits.

6. The apparatus of claim 1, further comprising a processing module to generate the second set of bits.

7. The apparatus of claim 6, wherein the processing module uses open loop control to generate the second set of bits.

8. The apparatus of claim 6, wherein the processing module uses closed loop control to generate the second set of bits.

9. The apparatus of claim 8, wherein the closed loop processing module generates the second set of bits based on at least one of temperature measurements, voltage measurements, frequency measurements, and circuit age measurements.

10. The apparatus of claim 6, wherein the spread pulse modulation module performs a second modulation of the duty cycle of the first modulation, based on information including a period of the second modulation and a duty cycle of the second modulation.

11. The apparatus of claim 10, wherein the processing module configures the period of the first modulation and the period of the second modulation.

12. An method for increasing the control resolution of an electronic device, comprising:
generating a first set of bits based on a second set of bits, wherein the second set of bits is larger than the first set of bits, and wherein the generating of the first set of bits includes performing a first modulation of the least significant bit of the first set of bits based on information including a period of the first modulation and a duty cycle of the first modulation, and wherein the least significant bit transitions at least twice from a high value to a low value during the period of the first modulation, and wherein a control signal input to the electronic device is determined based on the first set of bits.

13. The method of claim 12, wherein the least significant bit transitions on an edge of an update clock, and wherein the number of update clock cycles in a period of the first modulation is a power of two.

14. The method of claim 13, wherein the control signal input to the electronic device is an analog signal output of a digital-to-analog conversion module.

15. The method of claim 12, further comprising generating the second set of bits.

16. The method of claim 15, wherein the generating of the second set of bits is through open loop control.

17. The method of claim 15, wherein the generating of the second set of bits is through closed loop control.

18. The method of claim 17, wherein the generating of the second set of bits is based on at least one of temperature measurements, voltage measurements, frequency measurements, and circuit age measurements.

19. The method of claim 15, wherein the generating of the first set of bits includes performing a second modulation of the duty cycle of the first modulation, based on information including a period of the second modulation and a duty cycle of the second modulation.

20. The method of claim 19, further comprising configuring the period of the first modulation and the period of the second modulation.

* * * * *